(12) United States Patent
Skinner

(10) Patent No.: US 11,839,021 B2
(45) Date of Patent: *Dec. 5, 2023

(54) SPACING-ASSURED ELECTRIC FIELD SHIELD FOR GAS DISCHARGE TUBE OF MOTOR CONTROL

(71) Applicant: Nidec Motor Corporation, St. Louis, MO (US)

(72) Inventor: James L Skinner, Collinsville, IL (US)

(73) Assignee: Nidec Motor Corporation, St. Louis, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/159,696

(22) Filed: Jan. 26, 2023

(65) Prior Publication Data
US 2023/0171879 A1    Jun. 1, 2023

Related U.S. Application Data

(63) Continuation of application No. 17/095,103, filed on Nov. 11, 2020, now Pat. No. 11,596,057.

(60) Provisional application No. 62/933,673, filed on Nov. 11, 2019.

(51) Int. Cl.
*H05K 1/02* (2006.01)
*H02H 9/06* (2006.01)
*H01T 1/14* (2006.01)

(52) U.S. Cl.
CPC ............... *H05K 1/026* (2013.01); *H01T 1/14* (2013.01); *H02H 9/06* (2013.01)

(58) Field of Classification Search
CPC .... H01T 4/12; H01T 4/08; H01T 4/16; H01T 4/02; H01T 4/20; H01T 4/00; H01T 1/10; H01T 1/00; H01T 1/14; H01T 1/20; H01T 23/00; H01T 19/04; H01T 19/00; H01T 13/40; H01T 13/50; H01T 13/00; H01T 2/02; H01T 2/00
See application file for complete search history.

(56) References Cited

U.S. PATENT DOCUMENTS 11,596,057 B2 * 2/2023 Skinner ..................... H02H 9/06
2013/0090010 A1 * 4/2013 Darrow ..................... H02H 9/06
361/119

* cited by examiner

*Primary Examiner* — Bryan R Perez
(74) *Attorney, Agent, or Firm* — HOVEY WILLIAMS LLP

(57) ABSTRACT

A spacing-assured gas discharge tube assembly is installed on a printed circuit board, which may be part of a motor controller. The discharge tube assembly includes a tube body and an electrostatic spacing shield disposed at least partially around the tube body. The shield is configured to prevent close physical proximity of adjacent structures having electrostatic fields that may alter the breakdown voltage of the tube body.

10 Claims, 8 Drawing Sheets

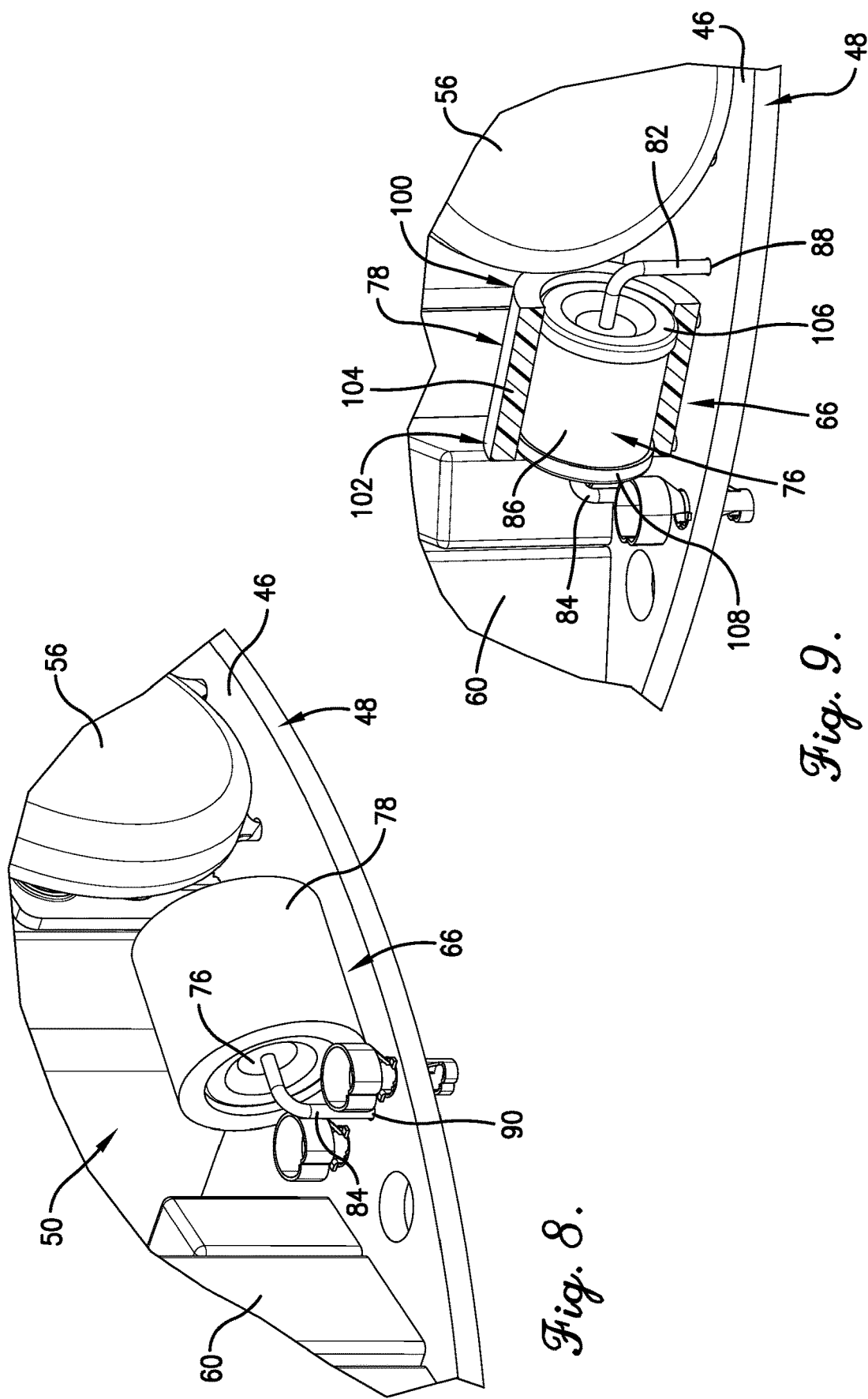

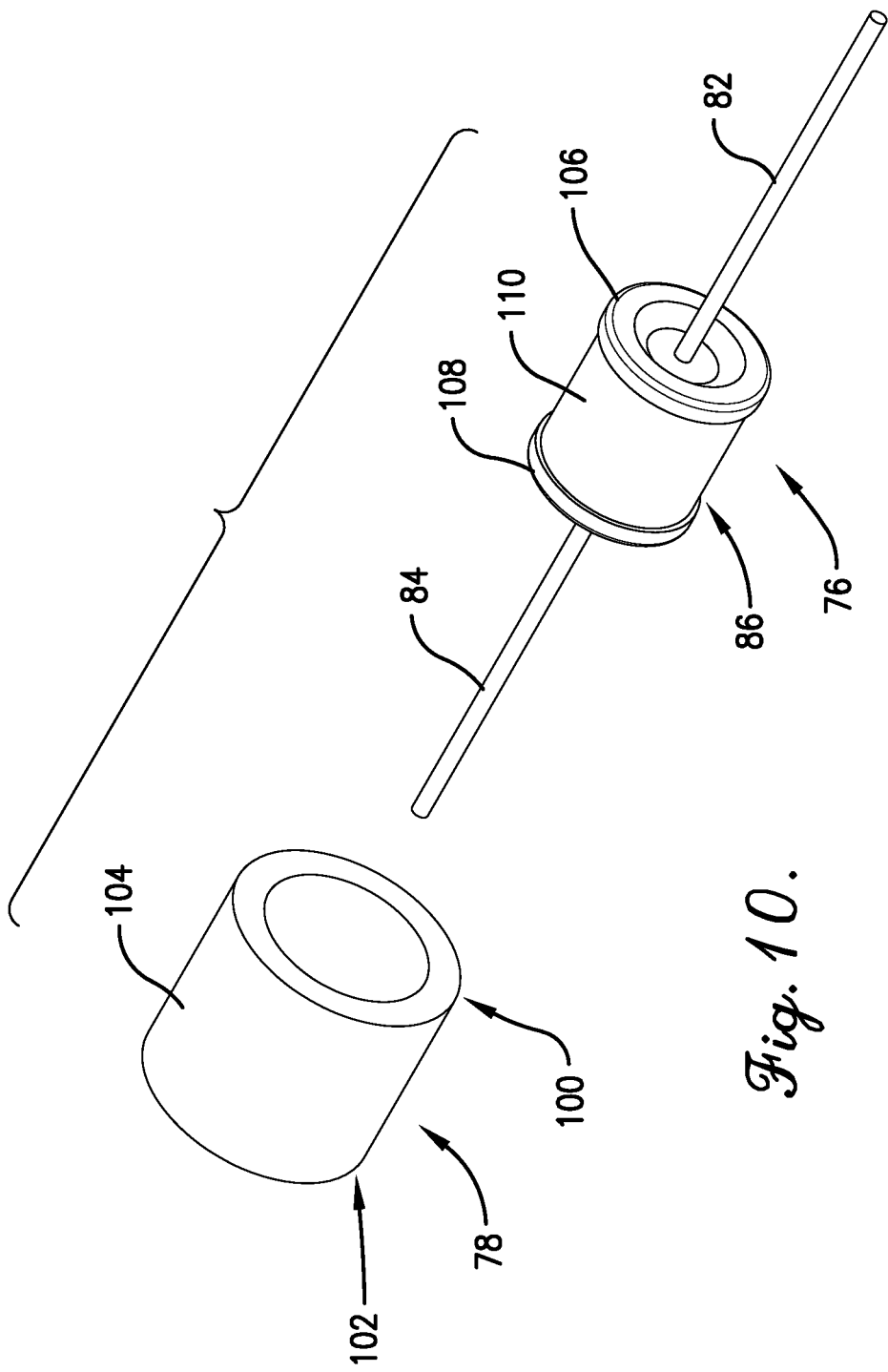

SPACING-ASSURED ELECTRIC FIELD SHIELD FOR GAS DISCHARGE TUBE OF MOTOR CONTROL

CROSS-REFERENCE TO RELATED APPLICATION

The present application is a continuation of U.S. patent application Ser. No. 17/095,103, filed Nov. 11, 2020, which claims priority from U.S. Provisional Patent Application No. 62/933,673, filed Nov. 11, 2019, the entire disclosure of each of which is hereby incorporated by reference herein.

FIELD OF THE INVENTION

The present disclosure generally relates to gas discharge tubes, such as those installed in electric motors and other applications.

BACKGROUND

Electric motors are conventionally used in applications including but not limited to heating, ventilation, and air conditioning (HVAC) systems; pumps; and home appliances. Such a motor may include a controller for controlling at least some operations of the motor. The controller may be housed in a controller can defining a controller compartment. Operation of the controller is susceptible to electrical disturbance, such as by power surges, lightning strikes, power switching, or other fault conditions. Gas discharge tubes are utilized to prevent damage to the controller in event of electrical discharge.

Gas discharge tubes operate on a spark gap principle. Upon a large enough potential difference, the air or other gas will ionize and provide an electrical conduit. The electrical conduit is commonly referred to as an arc. The large potential difference is created, for example, by the above discussed electrical disturbances. Absent the gas discharge tube, these electrical disturbances may cause damage to the various electronic components of the controller or may injure personnel in proximity.

The potential difference at which the gas discharge tube becomes conductive can be affected by nearby conductive components by altering the electric field in the gas and thus altering the ionization of the gas. While engineers may account for these spacing requirements of the gas discharge tube in their designs, problems can nonetheless arise. For example, variations in manufacturing may place some components closer to the gas discharge tube than in the plan. As another example, wear and tear (or other damage) of the controller may loosen or move internal components closer to the gas discharge tube. As yet another example, foreign debris may enter the controller during prolonged operation. As a result, the gas discharge tube may become conductive at a lower voltage than desired.

This background discussion is intended to provide information related to the present invention which is not necessarily prior art.

BRIEF SUMMARY

Embodiments of the invention solve the above-mentioned problem by providing a spacing-assured gas discharge tube assembly. The spacing-assured gas discharge tube assembly provides a physical barrier from other components coming too close to the gas discharge tube. The physical barrier prevents the other conductive components from coming too close to the gas discharge tube during manufacture, operation, maintenance, and other times.

According a first aspect of the present invention, a spacing-assured gas discharge tube assembly has a breakdown voltage potentially altered by electrostatic fields associated with adjacent structures. The spacing-assured gas discharge tube assembly includes a tube body configured to provide the breakdown voltage, a first lead, a second lead, and an electrostatic spacing shield disposed at least partially around the tube body. The shield is formed of a non-conductive material. The shield is configured to prevent close physical proximity of the adjacent structures, thereby reducing potential alteration of the breakdown voltage. Another aspect of the present invention concerns a motor controller for an electric motor. The motor controller includes a printed circuit board and a spacing-assured gas discharge tube assembly installed on the printed circuit board. The spacing-assured gas discharge tube assembly has a breakdown voltage potentially altered by electrostatic fields associated with adjacent structures. The spacing-assured gas discharge tube assembly includes a tube body and an electrostatic spacing shield surrounding at least part of the tube body. The shield is configured to prevent close physical proximity of the adjacent structures, thereby reducing potential alteration of the breakdown voltage.

Advantages of these and other embodiments will become more apparent to those skilled in the art from the following description of the exemplary embodiments which have been shown and described by way of illustration. As will be realized, the present embodiments described herein may be capable of other and different embodiments, and their details are capable of modification in various respects. Accordingly, the drawings and description are to be regarded as illustrative in nature and not as restrictive.

BRIEF DESCRIPTION OF THE DRAWINGS

The Figures described below depict various aspects of systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals. The present embodiments are not limited to the precise arrangements and instrumentalities shown in the Figures.

FIG. 8 is a first side perspective view of the spacing-assured gas discharge tube assembly mounted on a printed circuit board;

FIG. 9 is a second side perspective view of the spacing-assured gas discharge tube assembly, particularly illustrating an electrostatic spacing shield of the spacing-assured gas discharge tube assembly being shown in a partial cross-section view; and FIG. 10 is an exploded perspective view of the spacing-assured gas discharge tube assembly showing the separated gas discharge tube and shield.

Figure 1:
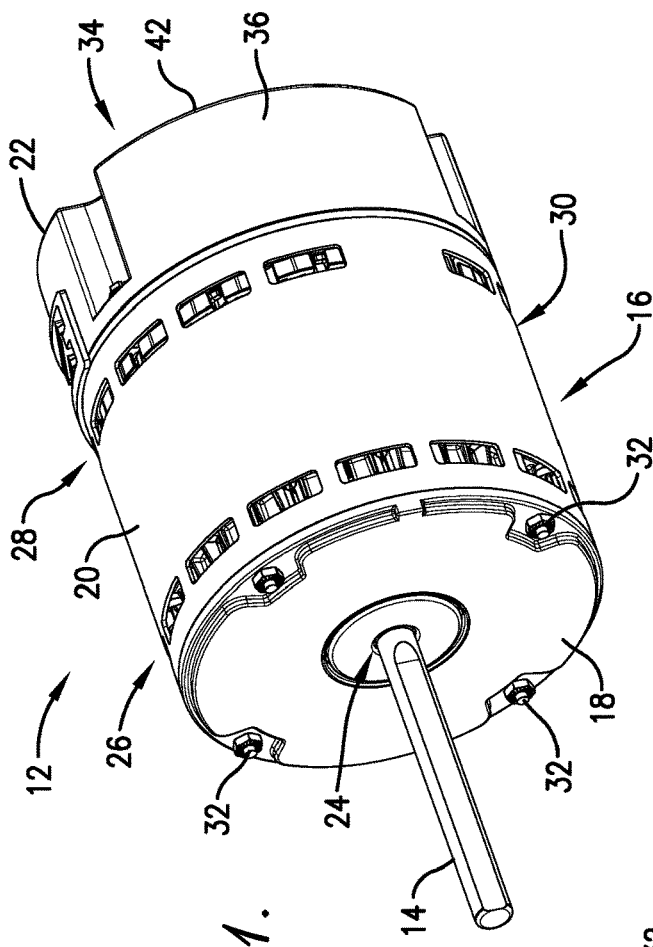
FIG. 1 is a first top perspective view of a motor in accordance with a first embodiment of the present invention.
Figure 2:
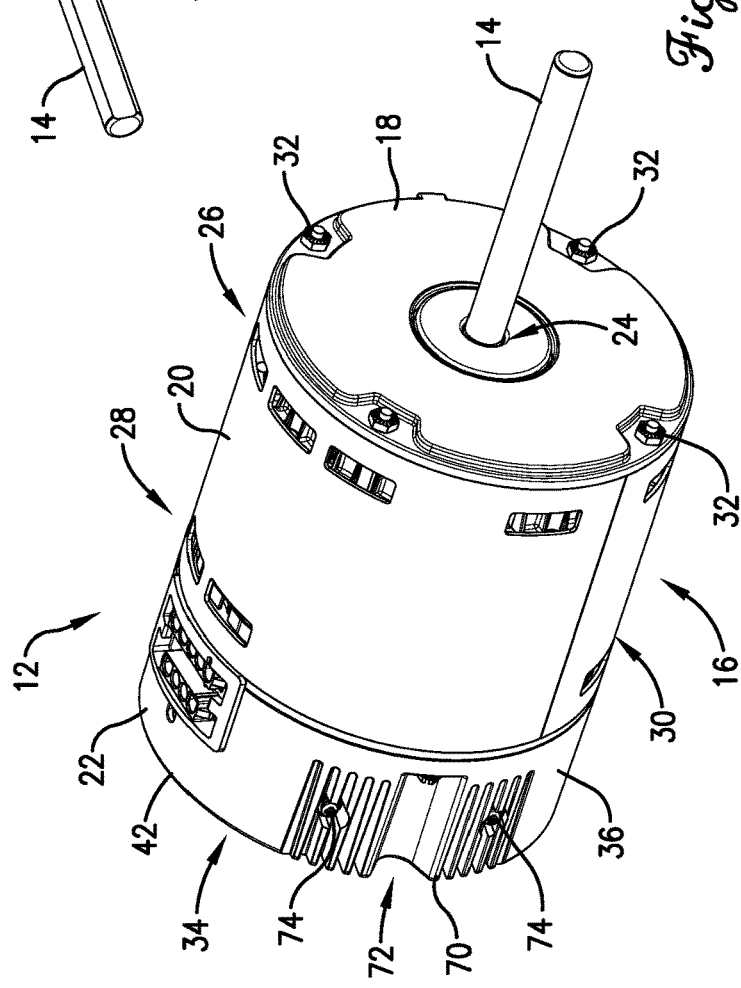
FIG. 2 is a second top perspective view of the motor of FIG. 1.

The Figures depict exemplary embodiments for purposes of illustration only. One skilled in the art will readily recognize from the following discussion that alternative embodiments of the systems and methods illustrated herein may be employed without departing from the principles of the invention described herein. While the drawings do not necessarily provide exact dimensions or tolerances for the illustrated components or structures, the drawings, not including any purely schematic drawings, are to scale with respect to the relationships between the components of the structures illustrated therein.

DETAILED DESCRIPTION

The present invention is susceptible of embodiment in many different forms. While the drawings illustrate, and the specification describes, certain preferred embodiments of the invention, it is to be understood that such disclosure is by way of example only. There is no intent to limit the principles of the present invention to the particular disclosed embodiments. For instance, the drawing figures do not limit the present invention to the specific embodiments disclosed and described herein. Furthermore, directional references (for example, top, bottom, up, and down) are used herein solely for the sake of convenience and should be understood only in relation to each other. For instance, a component might in practice be oriented such that faces referred to as "top" and "bottom" are sideways, angled or inverted relative to the chosen frame of reference.

Exemplary Electric Motor

Before discussing the spacing-assured gas discharge tube assembly in detail, an exemplary device or system in which it may be utilized will be discussed. It should be appreciated that the electric motor discussed herein and shown in the figures is a merely exemplary environment. The spacing-assured gas discharge tube assembly may be utilized in any of numerous practical applications.

Turning to FIGS. 1-4, an electric motor 12 according to the present inventive concept is illustrated. The motor 12 includes a rotor 13 and a stator (not illustrated). The rotor 13 includes a shaft 14. The rotor is rotatable about an axis at least in part defined by and/or along the shaft 14. However, an alternative rotation axis is permissible according to the present invention. For instance, a rotation axis might at least in part be parallel to, but spaced from, a shaft such that the shaft of the rotor does not define the output shaft of the motor 12.

In a preferred embodiment, as illustrated, the motor 12 is an inner rotor motor. According to certain aspects of the present invention, it is permissible, however, for an outer rotor motor, a dual rotor motor, or an alternatively configured motor to be used. The motor 12 may be operatively coupled to any one of a variety of machines, including but not limited to pool and spa pumps, furnace blowers, geothermal heat pumps, fan coil drivers, ventilators and/or filter units.

The motor 12 includes a motor housing 16 broadly having a first endshield 18, a second endshield (opposite the first endshield 18, not illustrated) a shell 20 extending between the endshields, and a controller can 22. The endshields and the shell 20 each may be formed of steel, although other materials (for example, plastic or aluminum) may be used without departing from the scope of some aspects of the present invention. The controller can 22 will be discussed in more detail below.

The shell 20 preferably presents a first axial end 26, a second axial end 28 spaced axially from the first axial end 26, and a shell margin 30 extending generally circumferentially between the first and second axial ends 26 and 28. The shell 20 preferably extends generally circumferentially along the shell margin 30 so as to at least in part circumscribe the stator 16. The shell margin 30 is preferably defined by the outer circumferential face of the shell 20 and is therefore substantially curved. Although the shell margin 30 is preferably at least in part structurally defined, continuous structural definition is not required according to some aspects of the present invention, for instance in embodiments where a shell includes one or more ventilation slots.

The first endshield 18 preferably is secured relative to the shell 20 adjacent the first axial end 26. That is, the first endshield 18 preferably extends generally radially adjacent the first axial end 26 across the opening presented by the shell 20 at the first axial end 26.

The first endshield 18 (with the exception of the shaft opening 24) is preferably at least substantially solid in construction. (See FIG. 2) Passage of contaminants through the first endshield 18 to the stator 16 is thereby at least substantially restricted. It is permissible according to some aspects of the present invention, however, for openings to be formed in a first endshield for any one or more of a variety of purposes, including but not limited to heat dispersion or ventilation. The endshields are preferably secured to shell 20 with a plurality of arcuately spaced bolts 32, though it is foreseen that any one or more of a variety of fasteners or connection types—for example, buckles, clamps, clasps, clips, latches, nails, pins, rings, straps, welds and/or friction fits—may be employed without departing from the spirit of the present inventive concept.

The controller can 22 preferably includes a generally radially extending end plate 34 (see FIG. 1) and a generally axially extending skirt 36 projecting transversely from the end plate 34 toward the shell 20. The can 22—and, more particularly, the skirt 36—presents a can diameter. Preferably, the can diameter is at least substantially constant and symmetrical about and along the rotational axis, although variation is permissible within the scope of the present invention. For instance, a skirt might expand in a linear manner or be flared, and/or fins may be incorporated asymmetrically thereabout, without departing from the spirit of the present invention.

The shell 20 similarly presents a shell diameter. Preferably, the shell diameter is at least substantially constant and symmetrical about and along the rotational axis, although variation is permissible within the scope of the present invention. For instance, the shell might expand in a linear manner or be flared within the scope of the present invention.

In embodiments, the can diameter and the shell diameter are substantially equal at the adjacent ends of the can 22 and the shell 20. That is, the can diameter immediately adjacent the second axial end 28 is preferably substantially equal to the shell diameter immediately adjacent the second axial end 28. Thus, the skirt 36 and the shell 20 may meet at one or more substantially continuous circumferentially-extending interface(s) at the second axial end 28 that enable electrical and thermal communication therebetween, it being understood that any such communication with the skirt 36 may be limited by the material used to construct the skirt 36.

Figure 3:
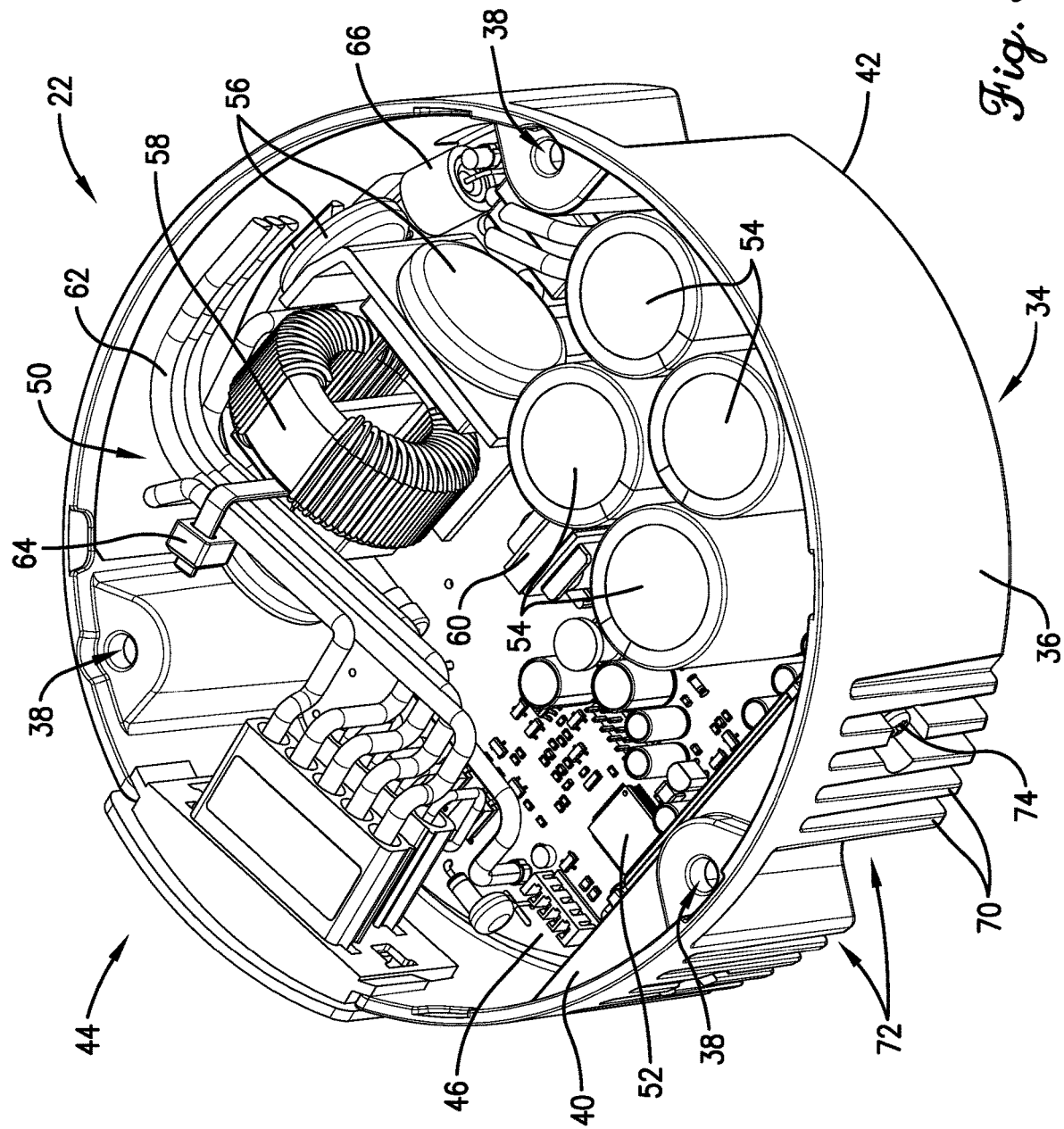
FIG. 3 is a top perspective view of a controller can of the motor of FIG. 1, particularly illustrating a controller disposed therein.
Figure 4:
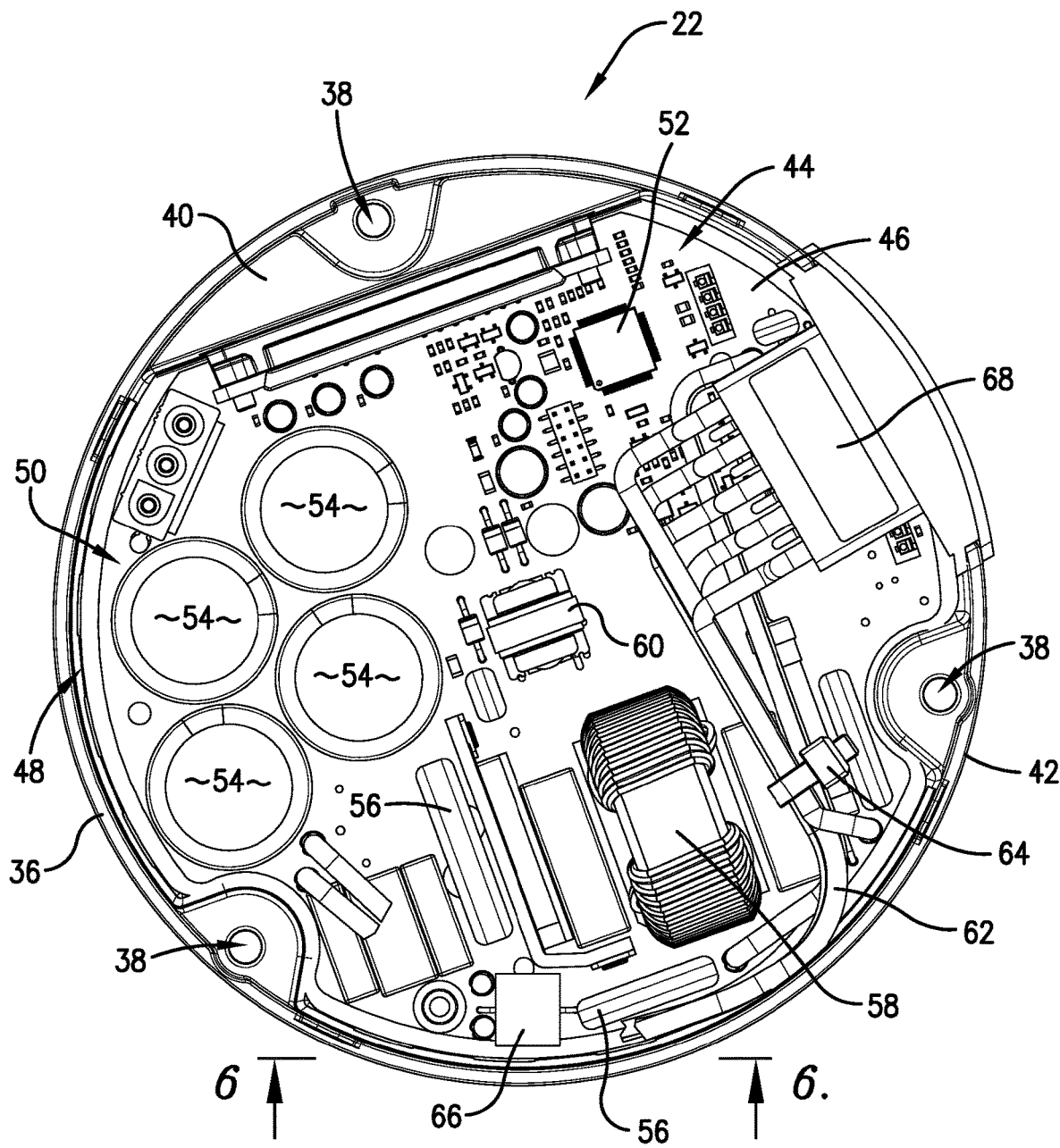
FIG. 4 is a top view of the controller can of FIG. 3.

Turning briefly to FIG. 3, the can 22 preferably defines at least one can fastener-receiving opening for securing a metal insert 40. For instance, a can housing 42 (also discussed in more detail below) may define two can fastener-receiving openings 38, and the metal insert 40 may define a third fastener-receiving opening 38. In this manner, at least one fastener preferably holds the metal insert 40 against the second endshield and/or the second axial end 28 of the shell 20. At least the fastener(s) extending through the metal insert 40 are preferably comprised of thermally and/or electrically-conductive materials. More preferably, such fastener(s) comprise copper and/or steel, though it is foreseen that other materials such as aluminum may be used without departing from the spirit of the present invention.

The motor 12 preferably also includes a controller 44. In a preferred embodiment, the controller 44 includes a substantially planar printed circuit board (PCB) 46 presenting an outer perimeter 48. (See FIGS. 8 and 9) The controller 44 further preferably includes a plurality of electronics components 50 mounted on the printed circuit board 46. The electronics components 50 may include primary control and/or pilot control devices, such as a power module (discussed in more detail below), a motor starter, float switches, pressure switches, magnetic contactors, contactor coils, circuit breakers and/or overload relays. However, any of a variety of controller types, configurations and components are permissible according to some aspects of the present invention. For example, the electronics components 50 may include a microprocessor 52, a set of capacitors 54, a battery 56, a coil 58, a fuse 60, wires 62, and harnesses 64. The various electronic components may further include a spacing-assured gas discharge tube assembly 66, which is discussed in detail below.

In a preferred embodiment, a connector element 68 is connected to the can 22. The connector element 68 is preferably configured for interconnection with an electrical conduit (not shown) and controller 44. More preferably, the connector element 68 is configured to carry power and control/configuration signals to and/or from the controller 44 for use in operation of the motor 12. However, it is within the scope of the present invention for a connector element to be configured for any required connection or to be excluded entirely from the motor. It is also permissible for an element to connect to a motor or housing at an alternative location. It should be appreciated that the power surges discussed herein may enter the controller 44 via the connector element 68 from some exterior source.

The metal insert 40 may comprise protrusions 70 and recesses 72 for thermal control. The metal insert 40 is secured to the can housing 42 and/or components 50. Fasteners 74 preferably comprise bolts, though it is foreseen that any one or more of a variety of fasteners or other connection types—for example, buckles, clamps, clasps, clips, latches, nails, pins, rings, straps, welds and/or friction fits—may be employed without departing from the spirit of the present inventive concept. The fasteners 74 may assist with thermal transfer between the controller 44 and the metal insert 40, and/or may provide grounding for the controller 44 to assist with controlling EMI emissions. The fasteners 74 therefore preferably comprise thermally and/or electrically conductive metal(s).

In some embodiments, the fasteners 74 may be directly or indirectly fixed to a power module of the controller 44 for transferring heat and/or EMI emissions to the insert 40 and/or an exterior of the can 22. One of ordinary skill will appreciate that grounding the controller 44 using the fasteners 74 may be achieved at least in part via contact between the fasteners 74 and the metal insert 40, and between the metal insert 40 and the shell 20. One of ordinary skill will appreciate that other methods and/or structures for securing a metal insert to a controller can, electronic components, endshield and/or shell—and/or to a motor more generally—are within the scope of the invention. For instance, a metal insert may be welded to a can housing without departing from the spirit of the present invention.

The metal insert 40 is preferably exposed to the exterior of the can 22, which may be an ambient environment and/or other heat sink. That is, the exterior of the can 22 is preferably capable of acting as a heat sink to absorb heat in order to support rapid heat transfer from the can 22 to an external heat sink space. The metal insert 40 preferably at least partially radially circumscribes the controller compartment to provide surface area and a medium for heat transfer to the external heat sink space.

Exemplary Gas Discharge Tube Assembly

Turning to FIGS. 5-10, an exemplary spacing-assured gas discharge tube assembly 66 is shown. FIGS. 5-9 show the spacing-assured gas discharge tube assembly 66 installed in the exemplary electric motor 12 that was discussed above. It should be appreciated that this is only an exemplary field of use for some embodiments of the invention. Other embodiments of the invention may be configured for use in any of various electronic devices. The electric motor 12 is thus shown and described to provide the reader with an exemplary field of use to aid in understanding. In embodiments of the invention, the spacing-assured gas discharge tube assembly 66 comprises a gas discharge tube 76 and an electrostatic spacing shield 78, as most clearly shown in FIGS. 9 and 10.

The gas discharge tube 76 is preferably configured to be connected to a printed circuit board 46 (or other electronic device). Gas discharge tubes 76 prevent damage to the printed circuit board 46, the electronic components associated with the printed circuit board 46, or other electronic devices. The gas discharge tube 76 prevents the damage by creating what is essentially a temporary short circuit. The temporary short circuit exists for so long as the gas is ionized and the conduction continues. As the conduction continues, the voltage drops to a lower value and continues at that lower value as long as current is available to maintain conduction. While the short circuit exists, the power surge current is allowed to move through the gas discharge tube 76 to a ground or other safe component. The gas discharge tube 76 may also have a minimum insulation resistance while in the non-conductive state.

When the potential difference across the gas discharge tube 76 increases, the gas discharge tube 76 enters a glow phase. In the glow phase the gas in the gas discharge tube 76 begins to ionize due to the charge developed across it. The glow phase begins when a certain sparkover voltage exists. During the glow phase, an increase in current flow and/or potential difference will eventually cause the above-mentioned short circuit. Current will pass through two conductors (not illustrated) of the gas discharge tube 76 upon the breakdown voltage being attained. The gas discharge tube 76 enters an arc phase while the potential is still above the arc voltage. Once the potential difference is reduced (for example, due to the current being discharged to ground), the gas discharge tube 76 will return to the glow phase and/or a default phase.

Embodiments of the invention are directed to a spacing-assured gas discharge tube assembly 66. The spacing-assured gas discharge tube assembly 66 comprises the gas discharge tube 76 and the spacing shield 78. The shield 78 acts a physical barrier to shield the discharge tube 76 from electrostatic fields associated with adjacent structures. That is, the spacing shield 78 prevents other components from coming in close physical proximity of the gas discharge tube 76. When certain electronic, metallic, or conductive materials come in close physical proximity to the gas discharge tube 76, the electrostatic field(s) associated with such close proximity structure(s) can alter the breakdown voltage from the default condition. This may cause the gas to ionize at a lower or a higher potential differential, depending on the specific situation.

As used herein, "close physical proximity" refers to a physical spacing between the gas discharge tube 76 and the other components at which the breakdown voltage alters from the default condition. Close physical proximity may thus depend upon the respective components and their physical and electrical properties. The shield 78 is designed to ensure that gas discharge tube 76 remains sufficiently spaced from adjacent structures so that electrostatic interference does not materially alter the rated breakdown voltage. Close physical proximity can be at least 0.030 inch, at least 0.040 inch, at least 0.050 inch, at least 0.053 inch, or at least 0.100 inch. Close physical proximity can be in a range of 0.010 to 0.100 inch, in a range of 0.030 to 0.060 inch, or (most preferably) in a range of 0.040 to 0.060 inch. More preferably, close physical proximity is at least 0.040 inch and most preferably 0.050 inch.

As used herein, "breakdown voltage" refers to a voltage differential across the gas discharge tube 76 at which the sparkover occurs. The breakdown voltage may be in a range of at least 2000 V, at least 2500 V, at least 2700 V, at least 2850 V, at least 3000 V, or some other value. The gas discharge tube 76 may be certified at a certain breakdown voltage, such as by independent entities like UL. Keeping other components out of the above-discussed close physical proximity allows the spacing-assured gas discharge tube 66 to continue to pass these tests while installed into the circuit board 46.

Figure 5:
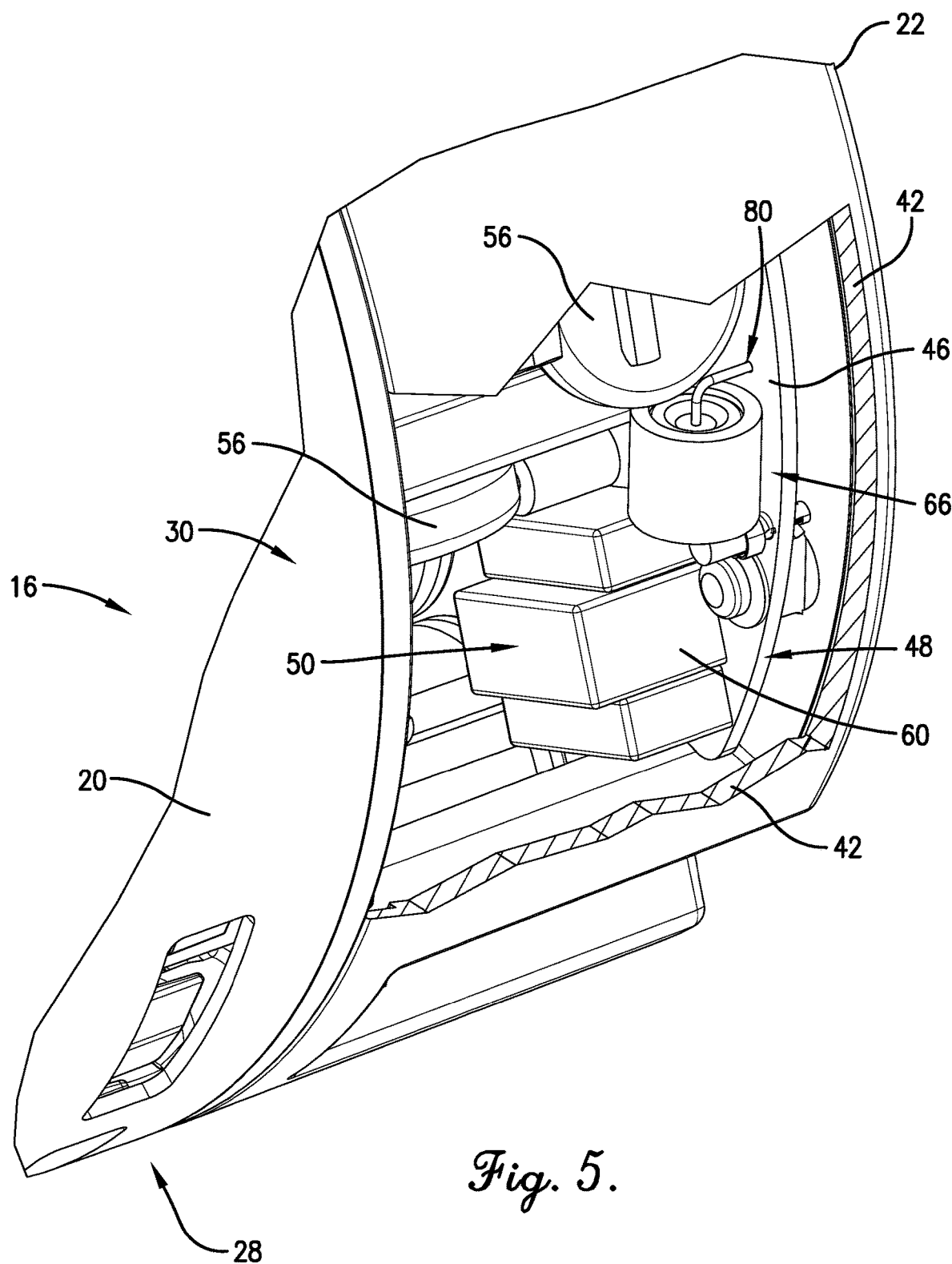
FIG. 5 is a partially-sectioned side perspective view of the motor of FIG. 1, particularly illustrating a spacing-assured gas discharge tube assembly mounted within the controller can.
Figure 6:
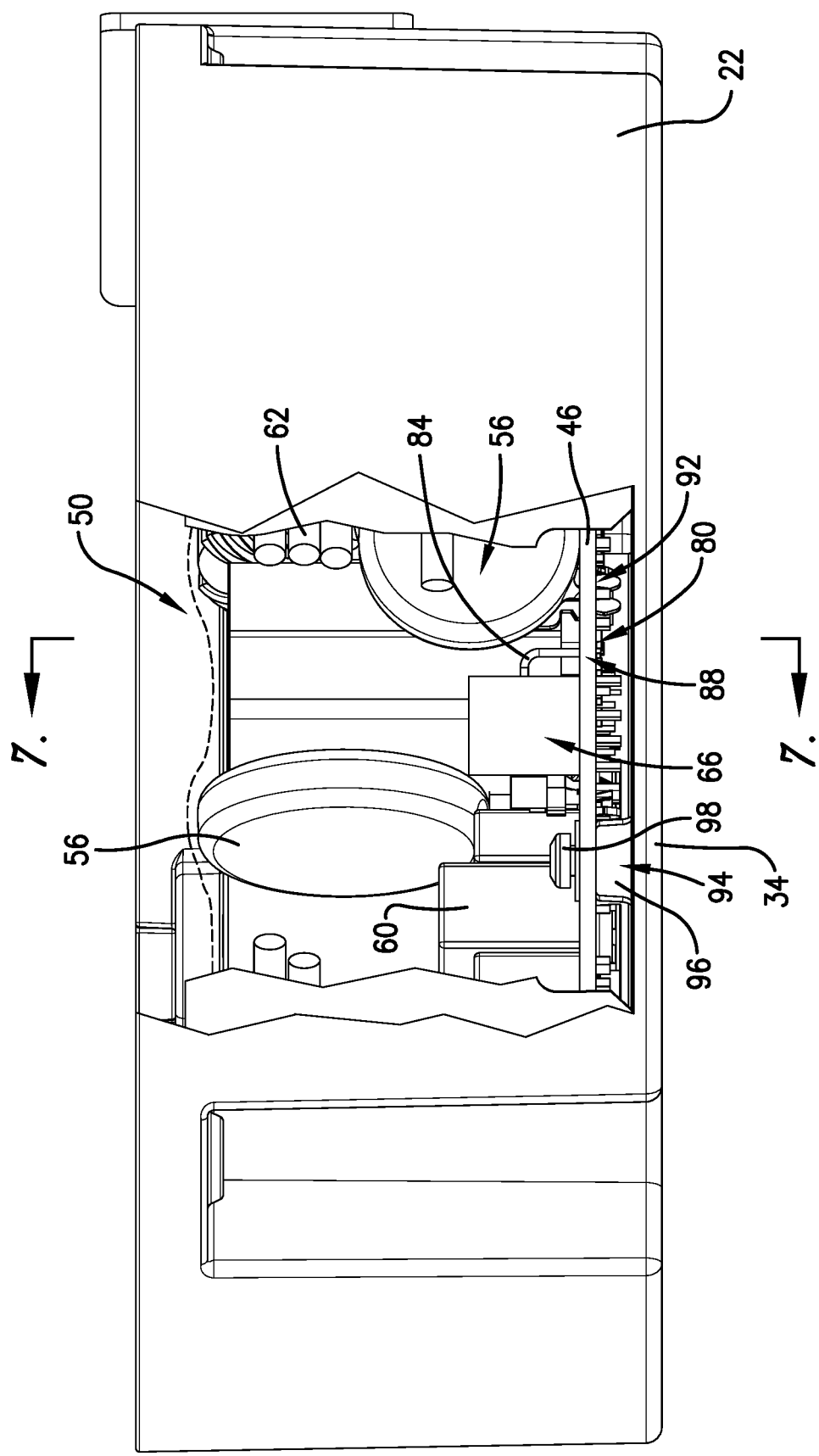
FIG. 6 is an enlarged side cross-sectional view of a portion of the controller can taken along line 6-6 in FIG. 4, particularly illustrating the spacing-assured gas discharge tube assembly mounted within the controller can.

Turning to FIG. 5, it can be seen that the spacing-assured gas discharge tube assembly 66 is installed in the above-discussed exemplary electric motor 12. The spacing-assured gas discharge tube assembly 66 may be configured to be installed in a through-hole 80 (as illustrated in FIG. 6) or surface mounted to the printed circuit board 46. It should be appreciated that the spacing-assured gas discharge tube assembly 66 may be installed anywhere on, in, or otherwise associated with the printed circuit board 46. According to certain aspects of the present invention, the tube assembly 66 need not be installed on the PCB, being otherwise located anywhere along the circuit of the controller 44, as long as the motor 12 maintains the desired operability.

As can be seen, the spacing-assured gas discharge tube assembly 66 of embodiments of the invention comprises the gas discharge tube 76 and the electrostatic spacing shield 78. The gas discharge tube 76 may be in any of numerous forms of gas discharge tubes common in the art. Embodiments of the gas discharge tube 76 comprise a first lead 82, a second lead 84, and a tube body 86. The first lead 82 is secured (such as by soldering) to the printed circuit board 46 at a first location 88 (as shown in FIG. 9). The second lead 84 is secured (such as by soldering) to the printed circuit board 46 at a second location 90 (as shown in FIG. 8). The tube body 86 is disposed between the first lead 82 and the second lead 84. Typically, the first lead 82 will be associated with (either directly or via the circuit) with the power input or other power source from which the surge or other electrical interruption may originate. The second lead 84 will be associated with (either directly or via the circuit) a ground. Thus, a power surge that overcomes the breakdown voltage will bypass the other electronic components (such as those discussed above) and be dissipated to the ground. According to certain aspects of the present invention, the gas discharge tube 76 may be alternatively electrically coupled to the circuitry of the controller 44.

Turning to FIG. 6, a side view of the spacing-assured gas discharge tube assembly 66 on the printed circuit board 46 is shown. In this figure, the second lead 84 can be seen passing through the printed circuit board 46, so as to be soldered from an underside 92 of the printed circuit board 46. The underside 92 of the printed circuit board 46 is disposed adjacent to a void 94 between the printed circuit board 46 and the end plate of the controller can 22. The void 94 is formed via one or more fastener bosses 96 protruding upward from the end plate 34. Fasteners 98 are secured through the printed circuit board 46 and into the fastener boss 96 to hold the printed circuit board 46 in place within the void 94.

Figure 7:
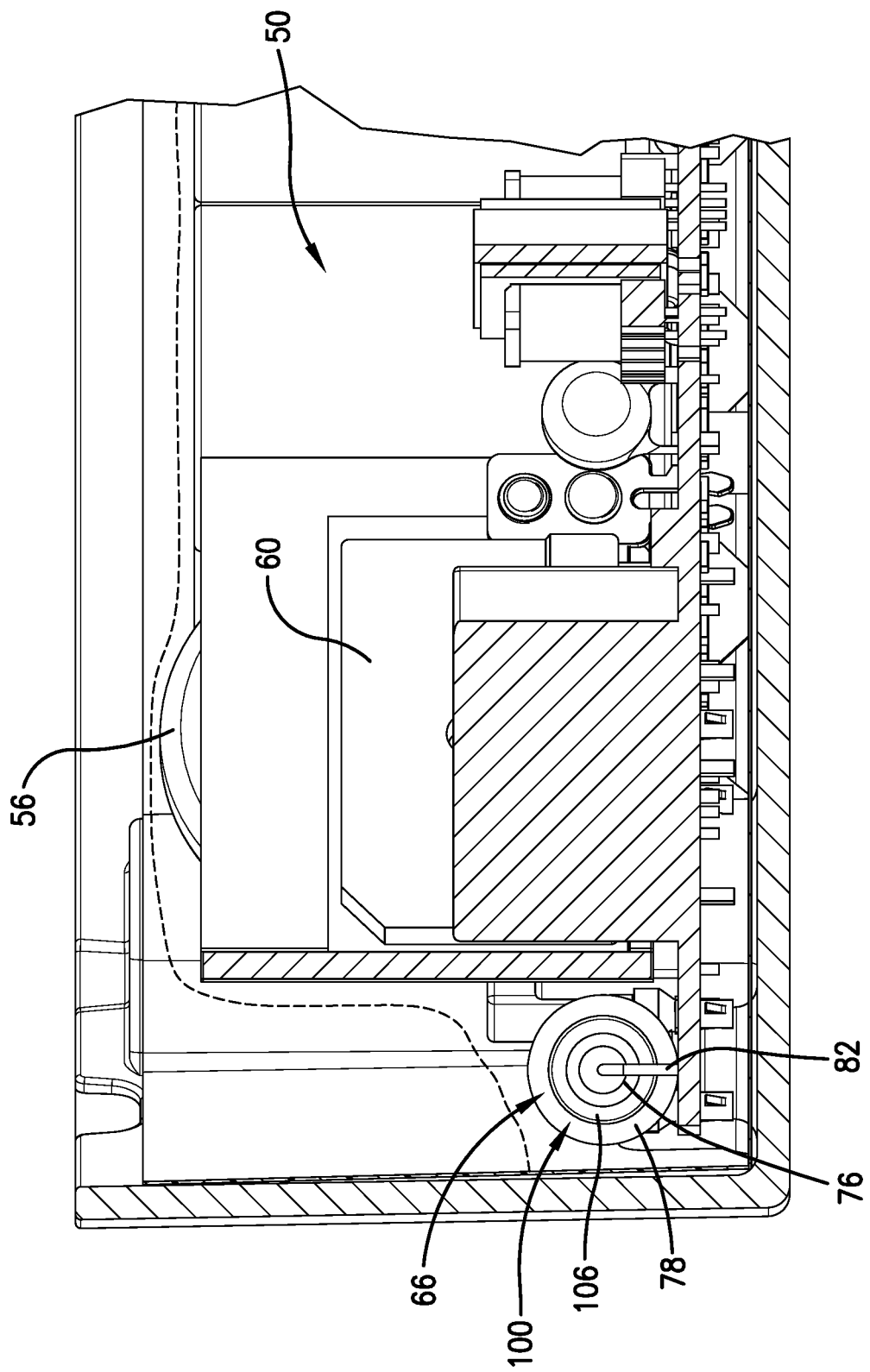
FIG. 7 is an enlarged side cross-sectional view of a portion of the controller can taken along line 7-7 in FIG. 6.

Turning to FIG. 7, a side view, generally perpendicular to the view of FIG. 6 is shown. In this figure, a first end of the spacing-assured gas discharge tube assembly 66 can be seen. The first lead 82 extends from the first end of the tube body 86 and bends downward toward the printed circuit board 46. It should be appreciated that in embodiments, the first lead 82 and the second lead 84 are initially straight (as shown in FIG. 10) and are later bent into the shape shown in FIGS. 6 and 7 after the spacing shield 78 is installed on the tube 76. As is customary (and as perhaps best shown in FIG. 9), the tube body 86 presents a cylindrical shape and is formed of a suitable material, such as ceramic or glass.

Turning to FIGS. 8 and 9, the spacing-assured gas discharge tube assembly 66 installed on the printed circuit board 46 is shown. As discussed above, in many instances (due to size constraints, for example), the spacing-assured gas discharge tube assembly 66 will need to be installed adjacent to other electrical components 50. In FIGS. 8 and 9, various exemplary electronics components 50 are shown near the gas discharge tube 76, but any of numerous other types of electronic, metallic, foreign debris, or other conductive materials (e.g., the controller can 22) may also be adjacent to the gas discharge tube 76 in practice. Thus, the spacing shield 78 prevents any adjacent structure(s) (including material(s)) from coming in close enough proximity to the tube body 86 (illustrated in FIG. 9) to negatively affect the breakdown voltage. It should also be appreciated that maintaining the minimum desired spacing, based upon the characteristics of the gas discharge tube 76 and the adjacent electronically conductive structures (e.g., components 50, can 22, foreign debris, etc.), has traditionally been problematic because the controller can 22 is typically at least partially filled with potting which can cause shifting of the tube 76 and adjacent structures. The addition of potting may also increase the effect of nearby components on the electric field and breakdown voltage of the gas discharge tube 76 due to a dielectric constant of the potting material being greater than a dielectric constant of the ambient air. The potting may thus increase the need for physical spacing around the gas discharge tube 76.

The shield 78 is most clearly shown in FIG. 9, in a partial cross-section view also showing the tube body 86 within the shield 78. The illustrated shield 78 has a tubular shape that at least partly surrounds the body 86. The shield 78 preferably presents a first end 100 and a second end 102 with a continuous, cylindrical wall 104 therebetween. As noted, the preferred shield 78 acts a protective sheath for the discharge tube 76, ensuring the desired spacing from adjacent structure(s). The cylindrical wall 104 consequently presents a diameter that is slightly larger than an outer diameter of the tube body 86. The cylindrical wall 104 also presents a minimum thickness corresponding to the close proximity dimensions described above. That is, the wall thickness of the wall 104 may be at least 0.030 inch, at least 0.040 inch, at least 0.050 inch, at least 0.053 inch, or at least 0.100 inch. More preferably, the minimum wall thickness is 0.040 inch and most preferably 0.050 inch.

The spacing shield 78 preferably has a shape corresponding to that of the tube body 86. Therefore, in the illustrated embodiment, tube body 86 and shield 78 are cylindrical. However, according to certain aspects of the present invention, the shapes of the tube body 86 and shield 78 need not be complemental. For example, in some embodiments, the tube body 86 may be cylindrical and the shield 78 might have a polygonal or other non-cylindrical cross-sectional shape. It is only critical for the shield 78 to be dimensioned and configured to appropriately space adjacent structure(s) and material(s) from the discharge tube 76. In this respect, certain aspects of the present invention encompass a shield that does not entirely circumscribe the tube body 86, or only circumscribes the tube body 86 along only part of the shield length. As a further example, if the components causing electrostatic interference are along only the bottom (adjacent the PCB) and sides of the tube 86, the shield may be open along the top.

Turning to FIG. 10, the spacing-assured gas discharge tube assembly 66 is shown as two separate components, the gas discharge tube 76 and the spacing shield 78. The gas discharge tube 76 comprises the tube body 86, the first lead 82 and the second lead 84. The tube body 86 comprises a first endcap 106, a second endcap 108, and a gap chamber 110. The gap chamber 110 is filled with the above-mentioned gas (such as a suitable noble gas, including but not limited to neon or argon) which begins ionizing upon attaining of the sparkover voltage and forms the above-discussed temporary short upon attaining of the breakdown voltage. The first endcap 106 and the second endcap 108 include the above-discussed conductors separated by an axially distance (or tube length) in which the gas is disposed. It should also be appreciated that the first endcap 106 and the second endcap 108 are not covered by the shield 78. This is because an electric field at the respective ends of the gas discharge tube 76 will not affect the breakdown voltage (as an electric field between the respective ends will). Therefore, in the preferred embodiment, the length of the shield 78 is at least substantially equal to the tube length (the dimension between the end caps 106 and 108).

In embodiments of the invention, the spacing shield 78 is a separate component distinct from the gas discharge tube 76 that is emplaced around the gas discharge tube 76 as a step of an assembly process to create the controller 44. In other embodiments, the spacing shield 78 may be originally manufactured to be included around the gas discharge tube 76. In still other embodiments, existing installed gas discharge tubes may be retrofitted with the spacing shield 78, such as by de-soldering (or otherwise removing) the gas discharge tube 76, emplacing the shield 78, and re-soldering (or otherwise reinstalling) the spacing-assured gas discharge tube assembly 66 in place. In still other embodiments, the shield 78 may be configured to fit around the existing gas discharge tube 76 such that no de-soldering is needed.

The shield is formed of an electrically non-conductive material, thereby preventing the shield itself from emitting an electrostatic field which could potentially alter the breakdown voltage. In preferred embodiments of the invention, the shield 78 may be formed of an elastic material such that it remains affixed to the tube body 86 once emplaced. In other embodiments, the shield 78 may be secured via a chemical adhesive, mechanical fastener, or the like. Again, the spacing shield 78 is preferably formed of an insulating (electrically non-conductive) material. The shield 78 may be formed of a material with a relative low dielectric constant. For example, the shield 78 may be formed of a plastic plumbing tubing, or other plastic tubing. The installer may select or cut an appropriately sized section of tubing and emplace the tubing around the gas discharge tube 76.

Additional Considerations

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Although the present application sets forth a detailed description of numerous different embodiments, it should be understood that the legal scope of the description is defined by the words of the claim(s) set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

I claim:

1. A motor controller for an electric motor, said motor controller comprising:
   a printed circuit board; and
   a spacing-assured gas discharge tube assembly installed on the printed circuit board,
   said spacing-assured gas discharge tube assembly having a breakdown voltage at risk of alteration by electrostatic fields associated with adjacent structures,
   said spacing-assured gas discharge tube assembly including—
   a first lead,
   a second lead,
   a tube body disposed between said first and second leads, and
   an electrostatic spacing shield formed of an electrically non-conductive material and disposed at least partially around the tube body,
   said tube body including a first endcap including a first conductor, and a second endcap spaced axially from the first endcap and including a second conductor,
   said tube body presenting a gap chamber extending between and interconnecting the first and second endcaps along a tube length defined between said first and second endcaps,
   said gap chamber containing a gas therein,
   said gas separating the first conductor and the second conductor and configured to ionize at the breakdown voltage,
   said shield being a separate component distinct from the tube body,
   said shield having a wall length at least substantially equal to the tube length, such that said first and second endcaps are at least partly exposed to the adjacent structures,
   said shield being configured to prevent close physical proximity of the adjacent structures to the tube body and the gas in the gap chamber thereof, thereby reducing the risk of alteration of the breakdown voltage.

2. The motor controller of claim 1, said shield being elastic.

3. The motor controller of claim 2, said shield being formed of a plastic tubing.

4. The motor controller of claim 1, said first and second leads extending from the tube body.

5. The motor controller of claim 1, said first lead being associated with a power source, said second lead being associated with a ground.

6. The motor controller of claim 1, further comprising:
   an electronic component installed on the printed circuit board, with the adjacent structures including the electronic component.

7. The motor controller of claim 1, said shield being separable from the tube body.

8. The motor controller of claim 1, said shield including a tubular wall that has the wall length.

9. The motor controller of claim 1, said shield continuously circumscribing the tube body along the wall length.

10. The motor controller of claim 1, said shield presenting a minimum wall thickness of at least 0.030 inch.

* * * * *